United States Patent [19]

Karg et al.

[11] Patent Number: 5,578,503
[45] Date of Patent: Nov. 26, 1996

[54] RAPID PROCESS FOR PRODUCING A CHALCOPYRITE SEMICONDUCTOR ON A SUBSTRATE

[75] Inventors: Franz Karg; Volker Probst, both of München, Germany

[73] Assignee: Siemens Aktiengesellschaft, Munich, Germany

[21] Appl. No.: 403,921
[22] PCT Filed: Sep. 7, 1993
[86] PCT No.: PCT/DE93/00814
  § 371 Date: May 9, 1995
  § 102(e) Date: May 9, 1995
[87] PCT Pub. No.: WO94/07269
  PCT Pub. Date: Mar. 31, 1994

[30] Foreign Application Priority Data

Sep. 22, 1992 [DE] Germany .......................... 42 31 706.1

[51] Int. Cl.$^6$ .................................................. H01L 31/18
[52] U.S. Cl. .............................. 437/5; 136/264; 136/265; 427/76; 437/234
[58] Field of Search ........................ 437/5, 234; 427/76; 136/264–265

[56] References Cited

U.S. PATENT DOCUMENTS 5,045,409  9/1991  Eberspacher et al. ................... 428/620

FOREIGN PATENT DOCUMENTS 0067860  12/1982  European Pat. Off. ................... 437/5
0195152   9/1986  European Pat. Off. ................... 437/5
0318315   5/1989  European Pat. Off. ................... 437/5
3822073   1/1990  Germany .

OTHER PUBLICATIONS

"The formation of CuInSe$_2$ thin films by rapid thermal processing", G. D. Mooney et al., *Solar Cells*, vol. 30, No. 1–4, May 1991, pp. 69–77.

"Production of CuInSe$_2$ thin films by rapid thermal annealing of stacked elemental layers", H. Oumous et al., *Ninth E.C. Photovoltaic Solar Energy Conference*, Sep. 25–29, 1989, pp. 153–156.

"Characterization of CuInSe$_2$ thin films produced by thermal annealing of stacked elemental layers", by N. Kavear et al., *Solar Energy Materials and Solar Cells*, vol. 27, No. 1, Jun. 1992, pp. 13–23.

"Scaleable, Large Area Compatible Technique for the Production of CuInSe$_2$ Based Solar Cells", by M. H. Badawi et al., *Tenth E.C. Photovoltaic Solar Energy Conference*, 8 Apr. 1991, pp. 883–886.

"Properties of copper indium diselenide thin films produced by thermal annealing of elemental sandwich structures", by A. Knowles et al., *Twentieth IEEE Photovoltaic Specialists Conference*, vol. II, Sep. 26–30, 1988, pp. 1482–1486.

"Photoluminescence study of CuInSe2 thin films prepared by the selenization technique", by M. Tanda et al., *Twenty Second IEEE Photovoltaic Specialists Conference*, vol. II, Oct. 7–11, 1991, pp. 1169–1172.

*Primary Examiner*—Aaron Weisstuch
*Attorney, Agent, or Firm*—Hill, Steadman & Simpson

[57] ABSTRACT

To produce a polycrystalline, single-phase compound semiconductor layer of the chalcopyrite type ABC$_2$, it is proposed to deposit, on a substrate, a layer structure which comprises a plurality of layers and which contains the components in elemental form, as an interelemental compound or as an alloy, the component C being present in stoichiometric excess. In a rapid annealing process with a heating rate of at least 10° C./s to a processing temperature of at least 350° C., the layer structure is converted into the compound semiconductor ABC$_2$ even after a few seconds, the gas exchange being limited by encapsulation of the layer structure, with the result that an evaporation of the most volatile components is prevented. Highly efficient solar cells can be produced from the semiconductor.

10 Claims, 1 Drawing Sheet

RAPID PROCESS FOR PRODUCING A CHALCOPYRITE SEMICONDUCTOR ON A SUBSTRATE

BACKGROUND OF THE INVENTION

High-efficiency solar cells are required for the inexpensive and competitive generation of power by converting sunlight into electrical power. They should have an efficiency of more than 10 percent, and better still more than 15 percent, and be stable over a period of at least 20 years.

Compound semiconductors of the chalcopyrite type are at present being investigated intensively for solar-cell purposes. High and stable efficiencies of almost 15 percent have already been achieved with polycrystalline thin-film solar cells composed of, for example, copper indium diselenide (CIS). However, yet further cell and process development is necessary for a large-scale industrial manufacture of such solar cells. On the one hand, the development should further simplify the manufacturing process, which requires an expensive process control to achieve high efficiencies of the solar cells produced. On the other hand, toxic compounds, such as hydrogen selenide, cadmium sulfide or cadmium telluride should be eliminated either from the manufacturing process or from the cell structure.

The layer-forming processes disclosed hitherto for producing chalcopyrite thin films can be differentiated essentially on the basis of one-stage and two-stage processes. A one-stage process disclosed, for example, in European Reference EP 678 609 B (Mickelsen et al.) provides a simultaneous vapor deposition of the elements Cu, In or Ga, and Se or S on a heated substrate, the compound semiconductor forming spontaneously on the substrate. In this process, however, the vapor-deposition rate of the elements Cu and In or Cu and Ga and, in particular, their ratio to one another have to be very precisely controlled. This requirement presents considerable problems in the production of large-area solar modules.

In contrast thereto, in the two-stage process disclosed, for example, in European reference EP 195 152 B, the metal layers (for example, Cu and In) are first deposited at room temperature. In a second step, the desired semiconductor compound is formed therefrom by an annealing process in a reactive selenium- or sulfur-containing atmosphere. Although this two-stage process can be extrapolated to large-area coating systems and the quantitative ratios of the individual components can be controlled better, an inadequate adhesion of the semiconductor layer to the metallic back electrode frequently occurs in this process. In addition, a precise temperature profile and an adequate selenium partial pressure must be maintained during the heating of the sample in order to obtain the desired layer properties. A further problem is the highly toxic processing gas, hydrogen selenide, required for the process and, in limited form, also the hydrogen sulfide. In addition, only batchwise manufacture, which considerably limits the quantitative turnover, can be implemented using the prolonged process of several hours' duration.

In a further variant of the two-stage process, the selenium or sulfur component is not incorporated via the gas phase but vapor-deposited directly in elemental form on the metallic layer assembly. Although the formation of the semiconductor proceeds more rapidly than in the abovementioned cases, thin-film solar cells produced therefrom prove unsatisfactory and only have efficiencies of less than 5 percent. The layers exhibit residues of secondary phases and also punctiform peeling from the substrate.

In a further variation of this process, CIS thin films are synthesized using a laser by RTA (rapid thermal annealing) from Cu/In/Se layer assemblies. However, the semiconductor layers obtained in this process were not single-phase, were of excessively small grain size, and were, in addition, n-type.

From a contribution by H. Oumous et al. in Proc. of the 9th EC PVSEC 1989, Freiburg/Breigau, pages 153 to 156, it is known, for example, to heat a stack comprising nine In/Se/Cu elemental layers at 10° C./s to 350° to 500° C. In addition to the chalcopyrite phase, this process also results in foreign phases which cannot be detected by X-ray diffraction analysis. These result in unusable solar cells. The multilayer structure is also expensive to implement in terms of processing and/or impossible to implement on large-area substrates. Excessively small grain sizes and an excessively low layer-thickness uniformity are observed.

A contribution to the 20th IEEE Photovoltaic Specialists Conference, Las Vegas, 26 to 30 Sep. 1988, pages 1482 to 1486, discloses a production process for copper indium diselenide thin layers, in which a sandwich-like stack of thin elemental layers of the starting components on a glass substrate is converted into the compound semiconductor by a laser treatment. This is followed by a thermal treatment in an inert atmosphere.

Solar Cells, volume 30, No. 1/4, May 1991, pages 69 to 77, discloses a process for producing copper indium diselenide thin layers on polycrystalline substrates. The elemental starting compounds are deposited by joint deposition (codeposition) using vacuum vapor deposition and converted into the semiconductor by a rapid heating process.

German Reference DE-A-38 22 073 discloses the production of thin copper indium diselenide layers by thermal treatment of thin elemental layers of the starting compounds.

European Reference EP-A-318 315 (corresponding to U.S. Pat. No. 5,045,409) discloses a production process for chalcopyrite semiconductor layers, in which elemental layer stacks of the starting components are converted into the compound semiconductor in an atmosphere containing hydrogen or hydrogen selenide.

The object of the present invention is therefore to provide an improved process for producing a chalcopyrite semiconductor, which is simple to carry out and is readily controllable and which produces a single-phase and homogeneous semiconductor from which solar cells can be produced which have high efficiencies. In addition, the processing should be safe as a result of avoiding toxic gases.

SUMMARY OF THE INVENTION

This object is achieved, according to the invention, by a process for producing a chalcopyrite semiconductor of the type $ABC_2$, where A is copper, B is indium or gallium, and C is sulfur or selenium, on a substrate. A layer structure is produced on the substrate by applying the components A, B, and C in elemental form and/or as a binary interelemental compound $B_2C_3$, the component C being present in an excess which forms up to twice the stoichiometrically exact proportion of component C. The substrate with the layer structure is rapidly heated to a processing temperature, which is greater than or equal to 350° C., at a heating rate of at least 10° C./s, and the substrate is kept at the processing temperature for a time interval dt of 10 seconds to 1 hour. An encapsulation is provided on the basis of a covering above the layer structure at a spacing of less than 5 mm, which encapsulation maintains, throughout the entire annealing process, a partial pressure for the component C which is above the partial pressure of C which would develop above a stoichiometrically exact $ABC_2$ semiconductor. Further developments of the invention are as follows.

The substrate with the layer structure is kept in a closed container for the purpose of encapsulation. A graphite container is used and the heating is carried out with a heating lamp.

The component A is applied in elemental form as a first layer of the layer structure.

The chosen heating rate is high enough for the processing temperature to be reached in less than 10 seconds. After reaching the desired processing temperature $T_p$, annealing is performed at $T_p$ for a length of time inversely related to $T_p$. The annealing is carried out at a total gas pressure of between 1 hpa and 1000 hpa.

The components A, B, and C are deposited in a molar ratio of 1:m:2n for the layer structure, where m is in the range of 0.9 to 1.3 and n is in the range of 1.0 to 1.8.

The components A and B are applied to the substrate in an amount of at least approximately 2 µmol/cm$^2$ and the component C is applied in an amount of at least 4.8 µmol/cm$^2$.

The components B and/or C are/is each replaced by an element of the same main group of the periodic system in proportions of 0 percent to 25 percent (atomic percent) in each case.

The most important parameters of the process according to the invention are the high heating rate AR of at least 10° C./s and the overpressure of the component C to be maintained during the annealing process. Overpressure is understood as meaning a partial pressure which is above the partial pressure which would develop above a stoichiometrically exact composition of the starting components A, B, and C in the ratio of 1:1:2.

With the specified high heating rate and a sufficiently high processing temperature $T_p$, the finished compound semiconductor is formed even after an annealing time dt of a few seconds. Compared with known processes, which require at least one hour of selenization, this is consequently an extremely rapid process.

The overpressure of the component C brings about a self-regulation of the stoichiometry of the compound semiconductor obtained. A homogeneous, that is to say single-phase, compound semiconductor of exactly the right composition is obtained even with a layer structure having an inexact 1:1:2 composition with respect to the starting components A, B, and C.

A direct reaction of the starting components to form the desired compound semiconductor is achieved by the high heating rate of the layer structure. Stable, but electronically interfering intermediate stages such as, for example, $Cu_{2-d}Se$, which have occurred hitherto, are avoided since the desired semiconductor forms directly. The semiconductor layer produced has a high adhesion to the substrate, which may be provided with a back electrode or without a back electrode. Punctiform layer peeling does not occur since local agglomerations of individual elements of the layer structure SA and their binary intermediate phases are avoided as a result of the high heating rate AR. A lateral layer growth, which is associated therewith and is consequently nonuniform, is prevented as a cause of layer bulging. A homogeneous layer growth is observed which results in an extremely homogeneous compound semiconductor layer having extremely low layer-thickness fluctuations.

The grain size of the chalcopyrite semiconductor is in the range from one to three times the layer thickness produced, with the result that the semiconductor layer does not have any grain boundaries which extend parallel to the plane of the layer and which would adversely affect the usability of the semiconductor layer for producing solar cells.

Solar cells produced therefrom have efficiencies of over 10 percent.

The overpressure of the component C is initially ensured by a stoichiometric excess and, during the annealing process, by an encapsulation of the layer structure. Encapsulation is understood in this case as meaning a restricted and "closed" gas space above the layer structure. Simple solutions for such an encapsulation are achieved by covering with a suitable material which is inert with respect to the process. A further possibility is to keep the substrate with the layer structure in a closed container for the purpose of annealing. A low leakage rate of the volume enclosed by the encapsulation, which permits a slow gas exchange at increased flow resistance, is always beneficial in this connection.

In this arrangement, the material or the type of covering is adapted to the type of heating. A rapid heating can be achieved, for example, if the substrate with the layer structure is placed in a graphite box for the purpose of encapsulation and is then irradiated by means of halogen lamps. As a result of the high absorption of the graphite, such a rapid heating is achieved that the processing temperature $T_p$ is reached in less than 10 seconds. In addition, the structure mentioned achieves an overpressure of reaction products having high vapor pressure, or the excessive loss of the component C because of its high vapor pressure is prevented during the annealing. At the same time, the spacing of the layer covering from the surface of the layer structure should be less than 5 cm and, preferably, less than 5 mm.

If the substrate is heated optically, the covering or encapsulation may also comprise other absorbing and nonreflecting materials or even transparent material such as quartz.

In addition to optical heating, other processes with which the high heating rate can be achieved are also possible, for example resistance heating or inductive heating.

The heating process and the annealing process are carried out under a process atmosphere composed of inert gas such as, for example, nitrogen or argon. At the same time, during most of the annealing, the processing pressure is above 1 hpa, preferably, however, near atmospheric pressure, that is to say just under 1000 hpa.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

The production of a layer structure and its conversion into a layer of the compound semiconductor $ABC_2$ is shown by FIGS. 1 and 2, while

DESCRIPTION OF THE PREFERRED EMBODIMENTS

Figure 1:
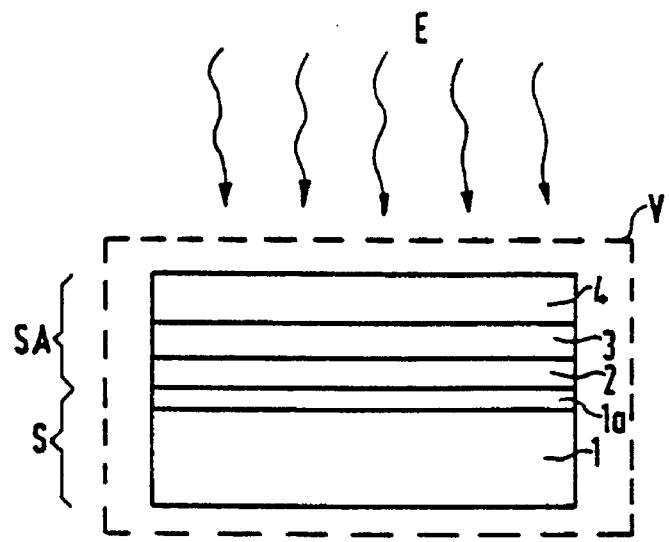

The substrate S used is normally a glass plate 1 composed of window glass. This may be provided with an adhesion layer, for example a thin chromium layer, to which the back-electrode layer 1a for the component to be manufactured from the semiconductor layer is applied. The process is not, however, restricted to these materials, with the result that many substrate/back-electrode combinations S which are normally used in solar cells are possible. Thus, the substrate 1 may be produced from any desired nonconducting or conducting materials, for example ceramic, graphite or steel. The back-electrode layer 1a may be any desired metal layer or even a thin conductive oxide, for example doped tin oxide or zinc oxide. Depending on the material of the substrate 1 and of the back-electrode layer 1a, a diffusion barrier layer such as, for example, titanium nitride or tantalum silicon nitride may be necessary between SA and S (FIG. 1).

The individual layers of the layer structure SA are now applied to the substrate S using conventional thin-film coating processes. Suitable processes are, for example, sputtering, vapor deposition, or electroplating. The total layer thickness of the layer structure SA depends on the desired layer thickness of the finished compound semiconductor, which should be, for example, between 0.1 and 5 µm. A CIS layer absorbs sunlight completely even at a layer thickness of 1 µm or more, with the result that CIS layers suitable for solar cells are normally produced in a thickness of at least 1 µm.

For the layer structure SA, the components A, B, and C of the compound semiconductor $ABC_2$ to be produced are applied in specific layers and in a suitable ratio of the components to one another. It is also possible to deposit the components B and C, at least partly, as interelemental compounds (for example, $In_2Se_3$ or $Ga_2Se_3$). The amount of C missing for the desired ratio of the components B and C is applied in elemental form. It is also possible to apply the components B and C as an alloy and, for example, to vapor-deposit them.

The component A is applied in elemental form as first layer 2. As described above, the layers 3 and 4 contain the components B and C or BC compounds in addition to C applied in elemental form. It is also possible to interchange the sequence of the layers 3 and 4, or to apply the total amount of the components A, B, and C as a multilayer in the form of more than three layers.

The components A, B and C are deposited in a molar ratio of 1:m:2n, where m may assume a value of 0.9 to 1.3, but is normally greater than 1. The index n may assume any desired value from 1.0 to 1.8, but, as a whole, is always chosen so that the component C is present in excess, with the result that the proportion of C is, for example, 20 to 100 percent above the stoichiometrically exact proportion in relation to A and/or B, the component present in an insufficient amount being taken, of course, as the standard.

According to one embodiment of the invention, the components A and B are applied to the substrate S in an amount of at least 2 µmol/cm² and the component C is applied in an amount of at least 4.8 µmol/cm².

In a further development of the invention, provision is made for the components B and/or C each to be replaced by an element of the same main group of the periodic system in proportions of 0 to 25 atomic percent in each case.

The coating temperature for the layer structure SA or for the layers 2, 3, and 4 is below 200° C. and is dependent, in detail, on the method of application, To convert the layer structure SA, it must now be subjected to a high-temperature process. For this purpose, the layer structure SA is first encapsulated, for example by covering the layer structure or inserting the substrate S with the layer structure SA into a closed container. The covering can be carried out by means of a film or a thin plate, and comprise, for example, metal, graphite, or quartz. In FIG. 1, the encapsulation is shown as a broken line. As a result of the encapsulation V, an overpressure of reaction products or components used which have high vapor pressure is able to build up during the annealing process, a slow gas exchange to the outside being enabled simultaneously.

The supply of energy, for example by radiation E using halogen lamps, must be capable of ensuring a sufficiently high heating rate AR, with the result that all the heat sources and encapsulation materials suitable from these points of view can be used.

The annealing process comprises a rapid phase of heating to the processing temperature $T_p$ of at least 350° C. In this operation, the heating time should be less than 30 seconds, preferably less than 10 seconds, with the result that a heating rate AR of at least 10° C./s is necessary. After reaching the processing temperature, annealing is continued for a further time interval dt, where dt may be from a few seconds to approximately 1 hour depending on $T_p$. For example, at 500° C., an annealing time of 20 seconds is adequate, whereas a processing temperature of 400° C. requires an annealing time of 5 minutes (for CIS in both cases).

Figure 2:
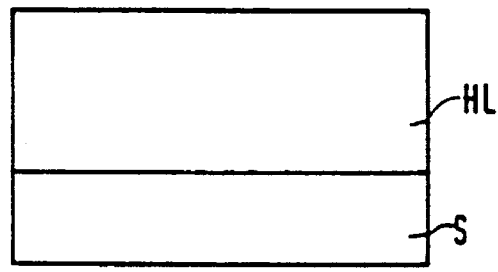

FIG. 2 shows the substrate S with the semiconductor layer HL produced thereon. The semiconductor layer HL is single-phase and therefore comprises only crystalline grains of the desired compound semiconductor $ABC_2$. The grain sizes achieved depend on the chosen processing temperature $T_p$ or heating rate AR and on the layer thickness d of the semiconductor layer HL produced, and are in the range from 1d to 3d. This ensures that only grain boundaries which extend perpendicularly to the plane of the layer and which ensure a high electronic quality of the semiconductor layer occur in the semiconductor layer HL.

The production of a CIS layer and of a solar cell based thereon are described below as an exemplary embodiment.

Exemplary Embodiment

Soda-lime glass is used for the substrate S and is provided with a molybdenum electrode. For this purpose, an approximately 1 µm thick molybdenum layer is deposited by sputtering. For the layer structure SA, the components A, B, and C are applied in the form of discrete layers of the elements Cu, In, and Se in the sequence mentioned, a total amount of 2 µmol/cm² being chosen for Cu, an amount of 2.15 µmol/cm² being chosen for In, and an amount of 5.8 µmol/cm² being chosen for Se, and this is sufficient for a layer thickness d of the finished CIS layer of approximately 1 µm. For other layer thicknesses d, the amounts applied have to be corrected accordingly.

The substrate with the layer structure SA is now heated to 400° C. in an atmosphere of nitrogen and at a pressure of approximately 800 hpa in a graphite box at a heating rate of 50° C./s by using halogen lamps. After an annealing time of approximately 5 minutes, a polycrystalline single-phase CIS film is produced which has good adhesion and a chalcopyrite structure, as demonstrated by the X-ray diffraction spectrum. The grain size is in the range from 1 to 3 µm and the film is p-type, with a resistivity of approximately 50 to 100 ohm-cm.

To manufacture a solar cell, a 10 nm thick n-type cadmium sulfide/zinc oxide window layer FS is produced thereon by known methods. A front electrode layer FE, for example 1 μm thick ZnO, and a grid-electrode structure GE and, optionally, a passivating layer or antireflection layer complete the structure.

Figure 3:
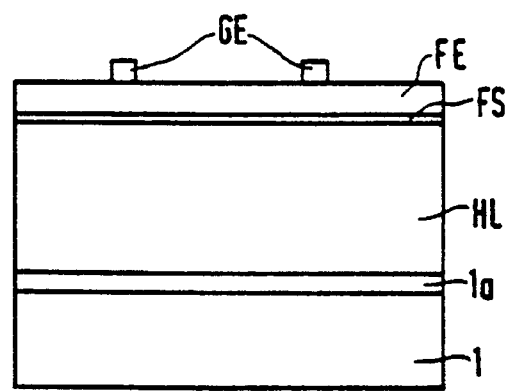
FIG. 3 shows a cross section through a solar cell produced therefrom.

The finished solar cells have efficiencies of more than 10 percent, accompanied by a no-load voltage of more than 415 mV, a fill factor of more than 65 percent and a short-circuit current of more than 38 mA/cm$^2$. FIG. 3 shows the finished solar cell.

The process according to the invention is eminently suitable not only for copper indium diselenide, which is tried and tested for solar cells, but also for producing other chalcopyrite materials. Compared with conventional processes, markedly reduced cycle times are achieved with the novel process, with the result that an almost continuous, inexpensive in-line manufacture can be implemented therewith.

Compared with a gas-phase selenization for producing a CIS layer, an acceleration of up to 200 times faster is produced by the process according to the invention for the semiconductor-forming process step.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A process for producing a chalcopyrite semiconductor of the type $ABC_2$, where A is copper, B is indium or gallium, and C is sulfur or selenium, on a substrate, comprising the steps of:

producing a layer structure on the substrate by applying the components A, B, and C in elemental form and/or as a binary interelemental compound $B_2C_3$, the component C being present in an excess which forms up to twice a stoichiometrically exact proportion of component;

rapidly heating the substrate with the layer structure to a processing temperature, which is greater than or equal to 350° C., at a heating rate of at least 10° C./s; and keeping the substrate at the processing temperature for a time interval dt in the range of 10 seconds to 1 hour to perform annealing;

providing an encapsulation as a covering above the layer structure at a spacing of less than 5 mm, which encapsulation maintains, throughout the entire annealing process, a partial pressure for the component C which is above the partial pressure of the component C which would develop above a stoichiometrically exact $ABC_2$ semiconductor.

2. The process as claimed in claim 1, wherein the substrate with the layer structure is kept in a closed container for the purpose of encapsulation.

3. The process as claimed in claim 2, wherein the closed container is a graphite container and the heating is carried out with a heating lamp.

4. The process as claimed in claim 1, wherein the component A is applied in elemental form as a first layer of the layer structure.

5. The process as claimed in claim 1, wherein the heating rate is high enough for the processing temperature to be reached in less than 10 seconds.

6. The process as claimed in claim 1, wherein the processing temperature is at least 500° C.

7. The process as claimed in claim 1, wherein the annealing is carried out at a total gas pressure of between 1 hpa and 1000 hpa.

8. The process as claimed in claim 1, wherein the components A, B, and C are deposited in a molar ratio of 1:m:2n for the layer structure, where m is in the range of 0.9 to 1.3 and n is in the range of 1.0 to 1.8.

9. The process as claimed in claim 1, wherein the components A and B are applied to the substrate in an amount of at least approximately 2 μmol/cm$^2$ and the component C is applied in an amount of at least 4.8 μmol/cm$^2$.

10. The process as claimed in claim 1, wherein at least one of the components B and C is replaced by an element of a corresponding main group of the periodic system in proportions of 0 percent to 25 percent (atomic percent).

* * * * *